United States Patent
Sugimoto (10) Patent No.: US 6,614,233 B2
(45) Date of Patent: Sep. 2, 2003

(54) APPARATUS FOR DETECTING BATTERY PACK ABNORMALITY AND METHOD OF DETECTING BATTERY PACK ABNORMALITY

(75) Inventor: Tomonaga Sugimoto, Fujisawa (JP)

(73) Assignee: Nissan Motor Co., Ltd., Kanagawa (JP)

(*) Notice: Subject to any disclaimer, the term of this patent is extended or adjusted under 35 U.S.C. 154(b) by 0 days.

(21) Appl. No.: 10/214,362

(22) Filed: Aug. 8, 2002

(65) Prior Publication Data

US 2003/0030442 A1 Feb. 13, 2003

(30) Foreign Application Priority Data

Aug. 9, 2001 (JP) ........................................ 2001-242273

(51) Int. Cl.[7] ............................................. G01N 27/416
(52) U.S. Cl. ..................................................... 324/434
(58) Field of Search ......................... 324/434, 426–433; 361/90, 79, 56, 57, 65; 320/116, 132

(56) References Cited

U.S. PATENT DOCUMENTS

| | | | | |
|---|---|---|---|---|
| 5,206,578 A | * | 4/1993 | Nor | 320/118 |
| 5,773,958 A | * | 6/1998 | Gow et al. | 320/118 |
| 6,072,300 A | * | 6/2000 | Tsuji | 324/429 |
| 6,509,718 B2 | * | 1/2003 | Sakai et al. | 320/116 |

FOREIGN PATENT DOCUMENTS

JP    2000-261901    9/2000

* cited by examiner

Primary Examiner—Edward H. Tso
Assistant Examiner—Pia Tibbits
(74) Attorney, Agent, or Firm—McDermott, Will & Emery (57) ABSTRACT

Cell controllers provided to control modules each constituted of a plurality of cells each calculate deterioration factors indicating the extents to which the cells under its control have become depleted and detect the deterioration factor of the cell in the most advanced state of depletion. The cell controller provided at the uppermost stage transmits the detected deterioration factor to the cell controller at the next stage. The subsequent cell controllers connected at the stages succeeding the uppermost stage each compare the deterioration factor detected therein and the deterioration factor transmitted from the cell controller at the proceedings stage and transmits the deterioration factor with the smaller value to the cell controller at the next stage. The cell controller at the lowermost stage, too, executes the processing described above and transmits the deterioration factor with the smaller value to a battery controller. The battery controller judges with regard to a cell abnormality based upon the deterioration factor transmitted thereto.

5 Claims, 8 Drawing Sheets

$f_0, f_1$ : DISCHARGE I-V CHARACTERISTICS

APPARATUS FOR DETECTING BATTERY PACK ABNORMALITY AND METHOD OF DETECTING BATTERY PACK ABNORMALITY

BACKGROUND OF THE INVENTION

1. Field of the Invention

The present invention relates to an apparatus for and method of detecting a cell abnormality by calculating through an arithmetic operation the state of depletion of a battery pack mounted on an electric car or the like.

2. Description of the Related Art

The methods adopted in the related art to calculate the state of depletion of a battery pack mounted an electric car or the like include a method through which the total voltage at the battery pack is detected and an average deterioration factor for all the cells is calculated based upon the detected total voltage and the charging/discharging currents flowing at the battery pack (see Japanese Laid-Open Patent Publication No. 2000-261901). In this method, the average deterioration factor of all the cells is calculated through a regression analysis executed by sampling the total voltage and the charging/discharging currents at the battery pack over a plurality of times.

SUMMARY OF THE INVENTION

However, some cells among the plurality of cells constituting a battery pack reach an advanced state of depletion while the rest of the cells, which account for a majority, remain virtually intact in reality. In other words, there is often marked inconsistency in the depletion characteristics among the plurality of cells and, as a result, if the battery SOC (state of charge) is calculated by using the averaged deterioration factor as in the related art, an error is bound to manifest between the calculated battery SOC and the actual battery SOC.

An object of the present invention is to provide an apparatus for and method of detecting a battery pack abnormality enabling to detect a cell abnormality by accurately ascertaining the state of depletion of a battery pack through an arithmetic operation.

In the battery pack abnormality detection apparatus that detects an abnormality occurring in a battery pack achieved by connecting in series a plurality of modules each constituted of a plurality of cells comprising a plurality of cell controllers connected in series to individually control the modules and a battery controller that controls the plurality of cell controllers and detects a cell abnormality, a cell controller at an uppermost stage among the plurality of cell controllers detects the individual states of depletion of the plurality of cells in the corresponding module and outputs the state of depletion of the cell at the most advanced state of depletion among the detected states of depletion to the cell controller at the next stage, the plurality of cell controllers connected at the subsequent stages succeeding the cell controller at the uppermost stage each detect the individual states of depletion of the plurality of cells in the corresponding module, compare the state of depletion of the cell at the most advanced state of depletion among the detected states of depletion with the state of depletion input from the cell controller at the preceding stage and output the most advanced state of depletion to the cell controller at the next stage, and the battery controller detects a cell abnormality based upon the most advanced state of depletion input from the cell controller at the lowermost stage.

A battery pack abnormality detection method for detecting an abnormality occurring in a battery pack achieved by connecting in series a plurality of modules each constituted of a plurality of cells comprising detecting individual states of depletion of the plurality of cells in the uppermost module and outputting the state of depletion of the cell at the most advanced state of depletion among the detected states of depletion to the cell controller at the next stage by a cell controller at an uppermost stage among the plurality of cell controllers, detecting individual states of depletion of the plurality of cells in the subsequent module succeeding the uppermost module, comparing the state of depletion of the cell at the most advanced state of depletion among the detected states of depletion with the state of depletion input from the cell controller at the preceding stage and outputting the state of depletion in a more advanced state to the cell controller at the next stage by a plurality of cell controllers connected at subsequent stages succeeding the cell controller at the uppermost stage and detecting a cell abnormality based upon the state of depletion in the most advanced state input from the cell controller at the lowermost stage by the battery controller.

DETAILED DESCRIPTION OF THE PREFERRED EMBODIMENT

Figure 1:
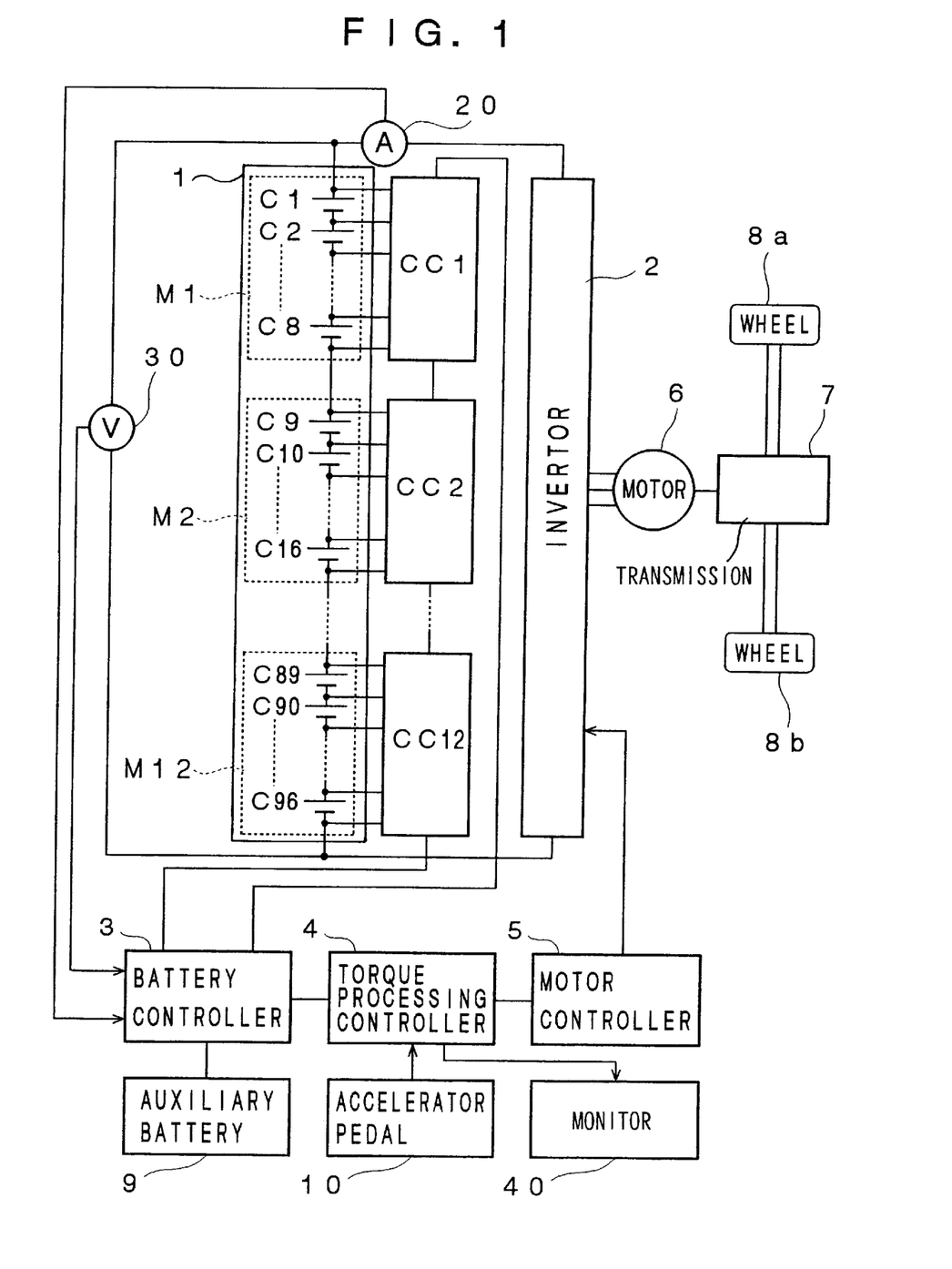
FIG. 1 shows the structure assumed in an embodiment which is achieved by adopting the battery pack abnormality detection apparatus according to the present invention in an electric car.

FIG. 1 shows the structure of an embodiment achieved by adopting the battery pack abnormality detection apparatus according to the present invention in an electric car. In this electric car, DC power in a battery pack 1 is converted to AC power at an invertor 2 and the AC power is supplied to a 3-phase synchronous motor 6 which constitutes a vehicle drive source. As the 3-phase synchronous motor 6 is driven to rotate by the supplied AC power, drive wheels 8a and 8b on the left and right sides are caused to rotate via a transmission 7, and thus, the electric car is driven.

In the battery pack 1, 96 cells C1~C96, for instance, are connected in series. The cells C1~C96 are grouped into units each having 8 cells to constitute modules M1, . . . , M12. It is to be noted that the number of cells provided to constitute the battery pack and the individual modules is not limited to the example given above. Cell controllers CC1, CC2, ... CC12, each provided in correspondence to one of the modules M1, ..., M12, control the cells in units of individual modules. Power is supplied to the cell controllers CC1~CC12 from an auxiliary battery 9.

The cell controllers CC1~CC12 detect the voltages at the individual cells connected thereto and also output signals to be used to adjust the capacities of the cells C1~C96 connected thereto, which are generated based upon a signal provided by a battery controller (B/C) 3, to a capacity adjustment circuit (not shown). The cell controllers CC1~CC12 are started up as a startup signal from the battery controller 3 is turned on, and once the startup signal is turned off, the cell controllers CC1~CC12, too, are turned off. In addition, the cell controllers CC1~CC12 each include a timer.

The battery controller 3 and the cell controllers CC1~CC12 are connected through a communication line. The battery controller 3, which includes a CPU, a ROM, a RAM, a transmission terminal and a reception terminal (not shown), controls the individual cell controllers CC1~CC12 and also receives data provided by the cell controllers CC1~CC12 through serial communication. Thus, the battery controller 3 is enabled to control the entire battery pack 1 by controlling the individual cell controllers CC1~CC12. It is to be noted that the power source of the battery controller 3 is the auxiliary battery 9.

In the embodiment, communication between the battery controller 3 and the cell controllers CC1~CC12 is achieved through serial transmission, as illustrated in FIG. 1, so as to obtain the most recent data on the plurality of cells C1~C96 while minimizing the number of communication lines. Cell voltage information transmitted from the individual cell controllers CC1~CC12 to the battery controller 3 indicates the totals of the cell voltages within the corresponding modules (hereafter referred to as module voltages) instead of the cell voltages at the individual cells C11~C96. Consequently, the communication speed is increased compared to the speed of the communication in which the information on the individual cell voltages is transmitted, and even when the cell voltages fluctuate during the communication, the most recent data can be transmitted.

A torque processing controller (TPC) 4, which includes a CPU, a memory and the like (not shown), calculates a torque command value for the 3-phase synchronous motor 6 based upon the extent to which an accelerator pedal 10 is depressed (accelerator opening degree), information on the vehicle speed and the like. The torque command value thus calculated is transmitted to a motor controller 5. The motor controller 5 calculates a current command value to be supplied to the 3-phase synchronous motor 6 from the invertor 2 based upon the torque command value provided by the TPC 4, information indicating the rotational position of the 3-phase synchronous motor 6, braking information and the like. The calculated current command value is then transmitted to the invertor 2. It is to be noted that the motor controller 5 includes a timer that counts the time.

A current sensor 20 detects charging/discharging current flowing at the battery pack 1, i.e., the current that flows when the battery pack 1 is being charged/discharged. The value of the detected current value is output to the battery controller 3. A voltage sensor 30 detects the total voltage at the battery pack 1 and outputs the results of the detection to the battery controller 3. A monitor 40, which is connected to the torque processing controller 4, displays information indicating that there is a cell determined to be at an advanced state of deterioration and, therefore, becoming depleted.

Figures 2A, 2B:
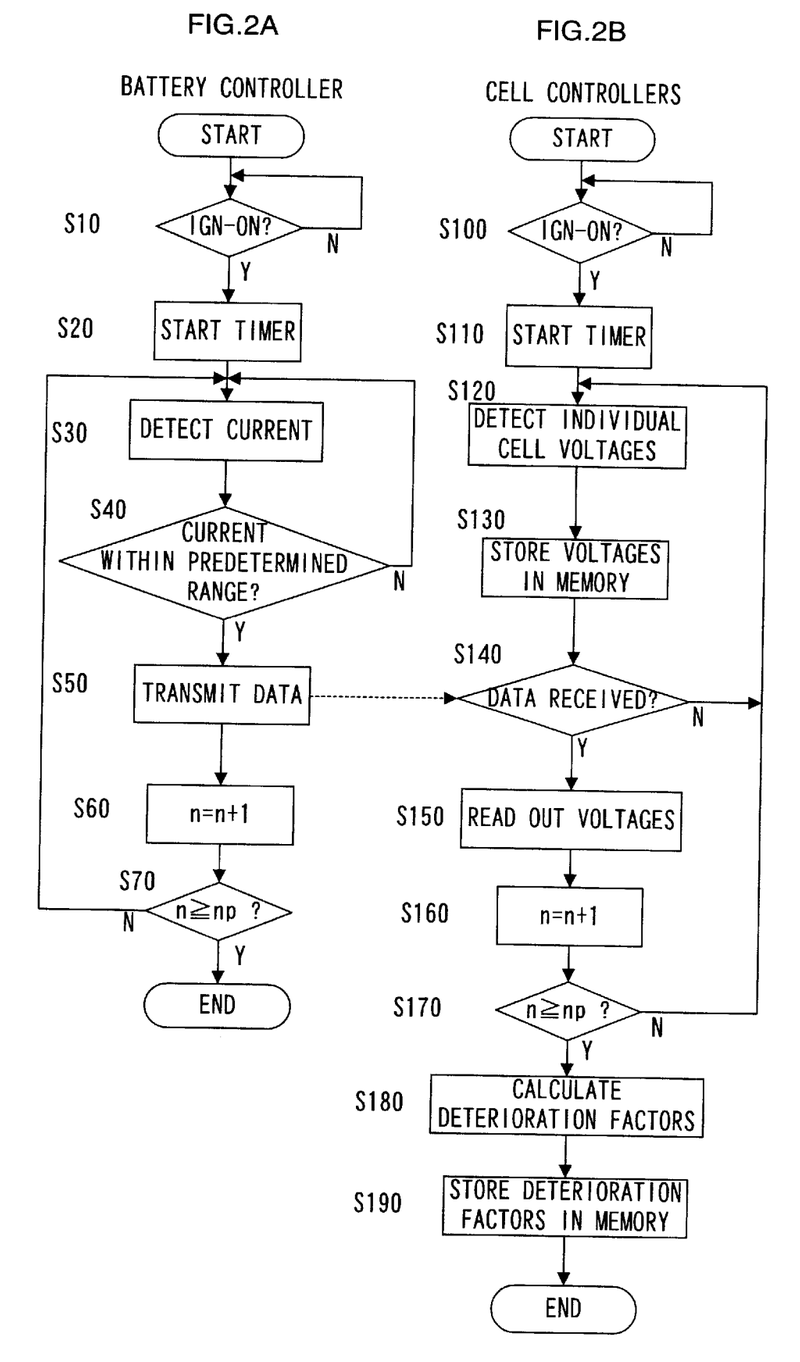
FIGS. 2A and 2B present flowcharts of the control procedures implemented by the battery controller and the individual cell controllers.

FIGS. 2A and 2B present flowcharts of the control procedures implemented by the battery controller 3 and the cell controllers CC1~CC12 respectively. First, the control procedure implemented by the battery controller 3 is explained. The processing in the flowchart presented in FIG. 2A, which is started up as an ignition switch (not shown) is turned on, is executed subsequently over predetermined time intervals. In step S10, it is judged as to whether or not the ignition switch (not shown) has been turned on. If it is judged that the ignition switch has been turned on, the operation proceeds to step S20, whereas if it is judged that the ignition switch has not been turned on, the operation remains in standby in step S10 until the ignition switch is turned on.

In step S20, a timer provided to count the time is started and then the operation proceeds to step S30. In step S30, the charging/discharging current flowing at the battery pack 1 is detected by the current sensor 20. The level of the detected charging/discharging current is stored in memory together with the length of time having been counted by the timer. In the following step S40, it is judged as to whether or not the level of the charging/discharging current detected in step S30 is within a predetermined current range.

A lithium ion battery achieves characteristics whereby the deterioration factor does not change linearly relative to a change in the current over a range in which the charging current is large or over a range in which a discharging current is large. Accordingly, the deterioration factor of a battery pack constituted of a lithium ion battery is calculated based upon a charging current in the high range or a discharging current in the high range, the calculation error is bound to be significant. For this reason, it is judged in step S40 as to whether or not the detected charging/discharging current is within the predetermined current range so as to calculate the deterioration factor through the procedure to be detailed later by using a current value within a predetermined range. The predetermined current range is set to ±5 [A] in the embodiment.

If it is judged in step S40 that the detected current is within the predetermined range, the operation proceeds to step S50, whereas if it is judged that the detected current is not within the predetermined range, the operation returns to step S30. In step S50, the value of the detected current and the length of time having been counted on the timer are transmitted as a set of information to the cell controllers CC1~CC12. It is to be noted that the set of data that includes the current value and the length of time counted on the timer is transmitted simultaneously to all the cell controllers CC1~CC12 through serial communication. Once the data are transmitted, the operation proceeds to step S60.

In step S60, the number n of sets of sampled data is incremented by 1 before the operation proceeds to step S70. It is to be noted that an initial value of 0 is set for the number n of sets of sampled data at the start of the processing shown in FIG. 2A. In step S70, it is judged as to whether or not the number n of sets of sampled data is equal to or larger than a specific value np. The number of sets of sampled data must be equal to or larger than a specific value to allow the regression analysis, which is to be explained later, to be executed when calculating the deterioration factor. If it is judged that the number of sets of sampled data is not equal to or larger than the specific value np, the operation returns to step S30 to execute the processing up to step S70 again. Once it is judged that the number of sets of sampled data is equal to or larger than the specific value np, the control ends. It is to be noted that the specific value np is set to 5 in the embodiment.

Next, the procedure of the control implemented by the cell controllers CC1~CC12 is explained. The control explained below is implemented by all the cell controllers CC1~CC12. The processing in FIG. 2B, which is started up as the ignition switch (not shown) is turned on, is subsequently executed over predetermined time intervals. These predetermined time intervals match the predetermined time intervals over which the control is implemented by the battery controller 3 as described earlier. Namely, the processing in FIG. 2A and the processing in FIG. 2B are started at the same time in synchronization with each other.

In step S100, it is judged as to whether or not the ignition switch (not shown) has been turned on. If it is judged that the ignition switch has been turned on, the operation proceeds to step S110, whereas if it is judged that the ignition switch has not been turned on, the operation remains in standby in step S100 until the ignition switch is turned on.

In step S110, the timers provided to count the time are started up before the operation proceeds to step S120. In step S120, the voltages at the individual cells C1~C96 are detected. The cell voltages are detected by the cell controllers CC1~CC12 which detect the voltages at the cells under their individual control. For instance, the cell controller CC1 detects the voltages at the cells C1~C8. Once all the cell voltages are detected, the operation proceeds to step S130. In step S130, the cell voltages detected in step S120 and the length of time counted by the timers having been started in step S110 are stored in memory.

In step S140, it is judged as to whether or not the set of data constituted of the level of the charging/discharging current and the length of time measured by the timer has been transmitted from the battery controller 3. Namely, it is judged as to whether or not the data transmitted in step S50 in the processing executed by the battery controller 3 have been indeed transmitted to the cell controllers CC1~CC12. If it is judged that the data have not been transmitted, the operation returns to step S120 to detect the cell voltages again and the detected cell voltages and the lengths of time measured by the timers are stored in memory in the following step S130. At this time, the cell voltages are additionally stored in memory instead of updating the cell voltage values having been stored previously. Thus, if it is continuously judged in step S140 that no data have been transmitted from the battery controller 3, the number of cell voltages stored in memory keeps growing. Accordingly, a limit is set to the number of cell voltages that can be stored in memory, and once the number of cell voltages stored in memory reaches the limit, the oldest cell voltage data are erased to allow the cell voltage data to be sequentially updated.

If it is judged in step S140 that the data have been transmitted, the operation proceeds to step S150. In step S150, the values of the individual cell voltages corresponding to the timer value (of the length of time countered by the timer) included in the data transmitted by the battery controller 3 are read out. In other words, the length of time counted by the timers of the cell controllers that matches or is the closest to the length of time counted by the timer included in the data transmitted from the battery controller 3 is extracted from the plurality of lengths of time counted by the timers stored in memory in step S130. Since the cell voltages and the corresponding length of time counted by the timers are stored in memory as a set, the cell voltages corresponding to the extracted length of time counted by the timers are read out. Once the cell voltages are read out, the operation proceeds to step S160.

In step S160, the number n of sets of sampled data is incremented by 1 before the operation proceeds to step S170. It is to be noted that an initial value of 0 is set for the number n of sets of sampled data at the start of the processing shown in FIG. 2B. In step S170, it is judged as to whether or not the number n of sets of sampled data is equal to or larger than a specific value np. In the embodiment, the predetermined value np is 5. If it is judged that the number n of sets of sampled data is not equal to or larger than the specific value np, the operation returns to step S120 to execute the processing up to step S170 again. Once it is judged that the number n of sets of sampled data is equal to or larger than the specific value np, the operation proceeds to step S180. In step S180, two deterioration factors, i.e., an internal resistance deterioration factor $\gamma$ and a capacity deterioration factor $\beta$, are calculated.

Figure 3:
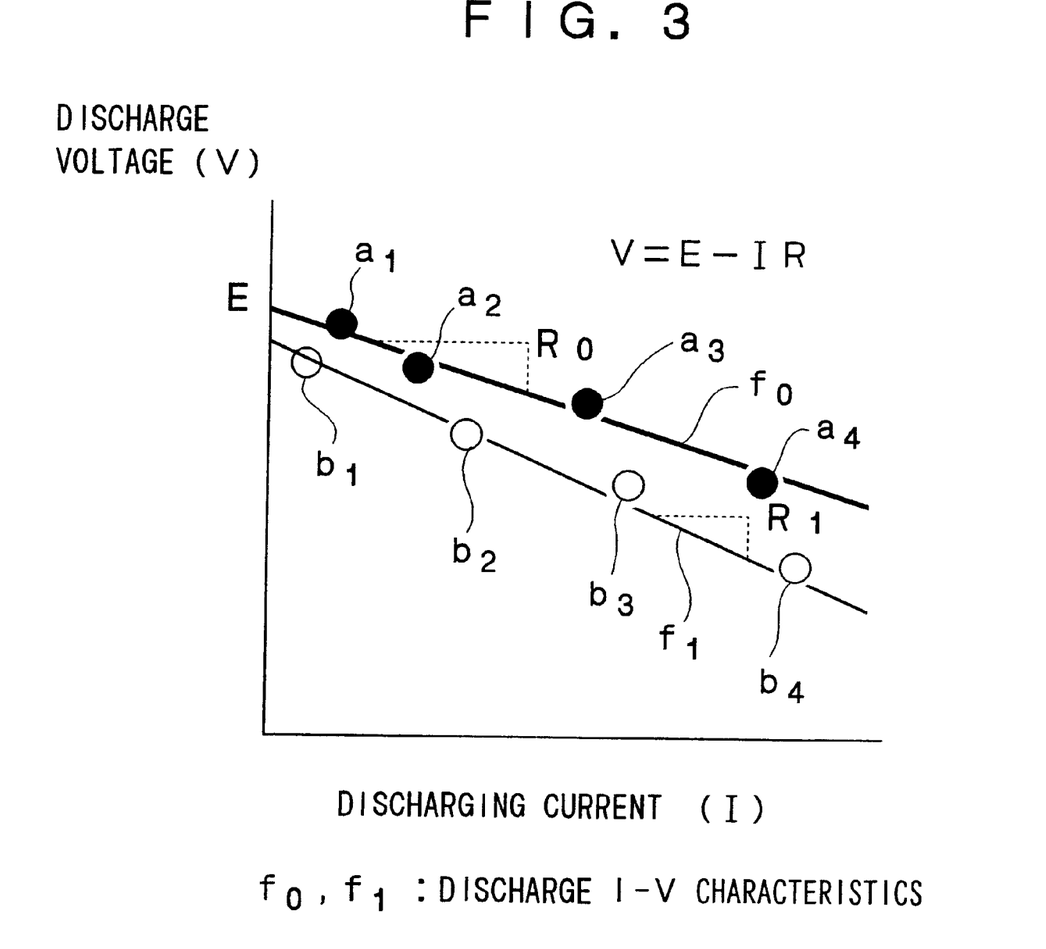
FIG. 3 illustrates a method that may be adopted to calculate the internal resistance deterioration factor γ.

First, the method adopted to calculate the internal resistance deterioration factor $\gamma$ is explained. FIG. 3 illustrates the relationship between the discharging current and the discharge voltage. a1~a4 and b1~b4 in FIG. 3 are obtained by measuring the discharging current I and the discharge voltage V over a plurality of times during a discharge operation and by plotting the measurement data (I, V). The data a1~a4 are measurement data obtained by using a new battery, whereas the data (b1~b4) are measurement data obtained by using a battery in a depleted state after an extended period of use. In addition, f0 and f1 are discharge IV characteristics lines obtained through linear regression analyses executed by using the data (a1~a4) and the data (b1~b4) respectively. The inclinations of these IV characteristics lines each indicate the internal resistance R in the battery, and the point at which each IV characteristics line and the vertical axis representing the discharge voltage V intersect indicates an estimated open circuit voltage E of the battery. Accordingly, the IV characteristics lines can each be expressed as in (1) below.

$$V = E - IR \quad (1)$$

Since the characteristics line f0 is ascertained through the calculation executed by using the data available when the battery is new, it can be obtained in advance. The characteristics line f1, on the other hand, must be obtained based upon the current detected in step S30 during the processing implemented by the battery controller 3 and the voltages read out in step S150 during the processing executed by the cell controllers CC1~CC12. An initial internal resistance R0 (the internal resistance manifesting when the battery is new) of the battery can be ascertained based upon the characteristics line f0, whereas an internal resistance R1 in a depleted state is ascertained based upon the characteristics line f1. The internal resistance deterioration factor $\gamma$ can be calculated through the following formula in (2) based upon the initial internal resistance R0 and the internal resistance R1 in the depleted state.

$$\gamma = R0/R1 \quad (2)$$

Figure 4A:
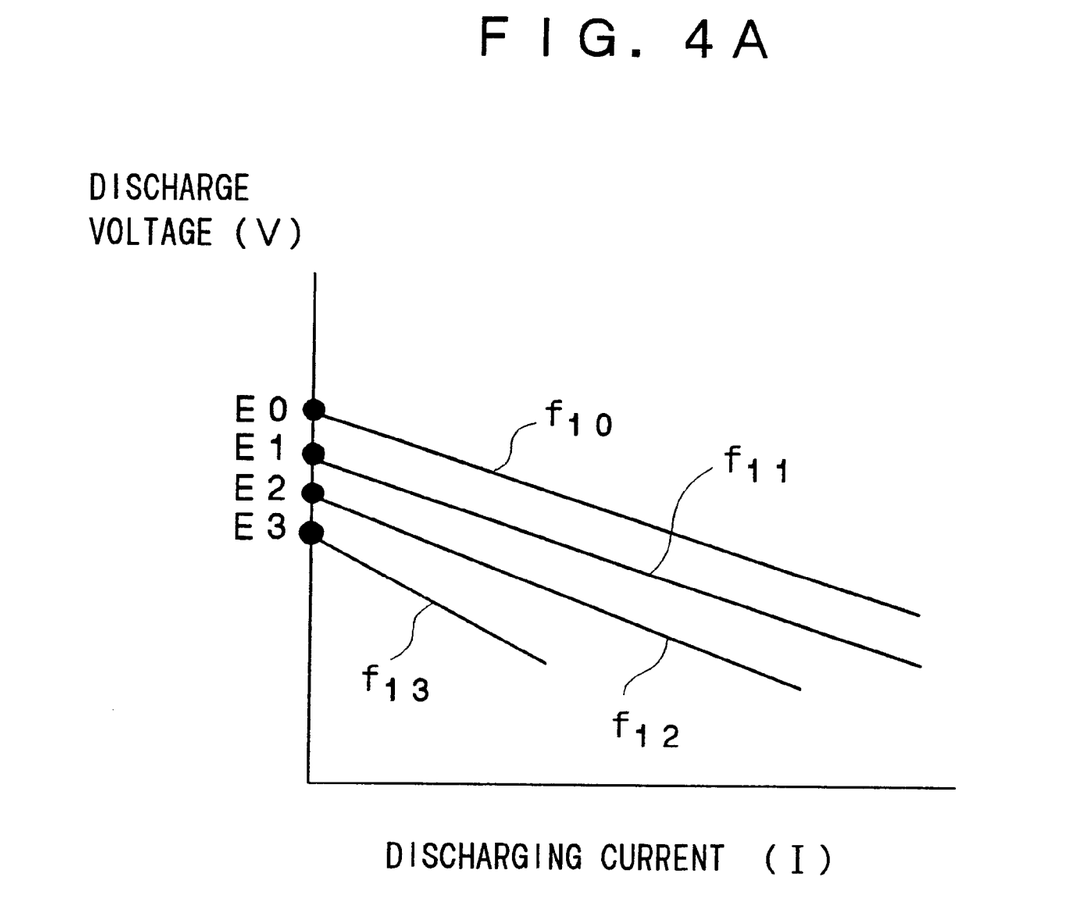
FIGS. 4A and 4B illustrate a method that may be adopted to calculate the capacity deterioration correction coefficient β.

Next, the method adopted to calculate the capacity deterioration correction coefficient $\beta$ is explained. FIG. 4A shows the discharge IV characteristics of the battery at varying discharge depths DOD. A line f10 represents the discharge characteristics manifesting when the quantity of discharged electricity Ah equals 0, i.e., when the DOD is at 0 (when the battery is fully charged). The quantities of the discharged electricity Ah corresponding to lines f11, f12 and f13 are respectively Ah1, Ah2 and Ah3 (Ah1<Ah2<Ah3). In other words, as the quantity of discharged electricity Ah increases from 0→Ah1→Ah2→Ah3, the characteristics line changes from f10→f11→f12→f13, with the corresponding estimated open circuit voltage also changing from E0→E1→E2→E3. It is to be noted that the open circuit voltage may be estimated based upon the charge/discharge IV characteristics, or the actual open circuit voltage which can be ascertained by measuring the voltage in an no-load state may be used for the open circuit voltage, instead. When the battery pack 1 is constituted of a lithium ion battery or a nickel hydrogen battery, the accuracy with which the open circuit voltage is estimated by using the line representing the charge/discharge IV characteristics is high with only a slight error manifesting between the estimated open circuit voltage and the actual open circuit voltage.

The estimated open circuit voltages E0~Ej are each ascertained based upon the current detected in step S30 during the processing executed by the battery controller 3 and the voltages read out in step S150 during the processing executed by the cell controllers CC1~CC12, and the relationship of the open circuit voltage E(V) to the quantity of discharged electricity C(Ah) is calculated through a regression analysis of the first order or higher.

Figure 4B:
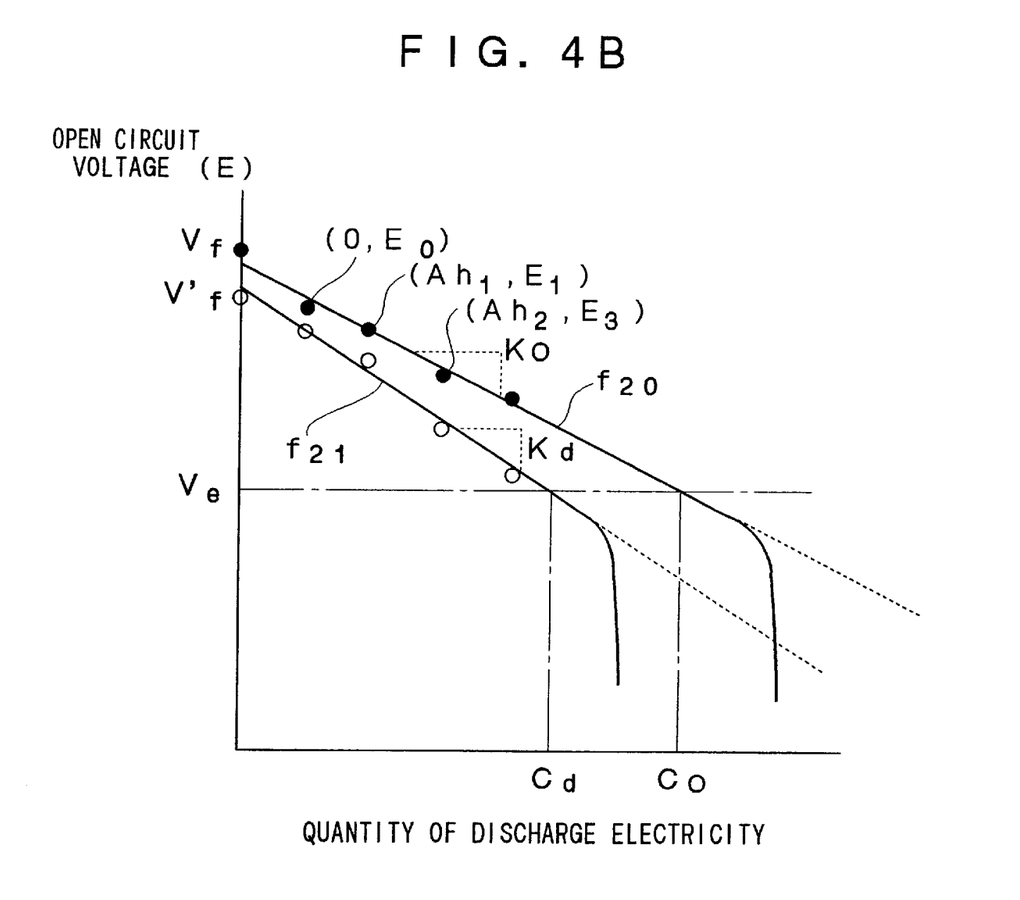

FIG. 4B shows the regression curves calculated for a lithium ion battery. The battery characteristics of a lithium ion battery can be ascertained with a high degree of accuracy even through a linear regression analysis. f20 and f21 respectively represent the characteristics in an initial state of the battery and the actual characteristics (in a depleted state). The battery characteristics shown in FIG. 4B may be expressed as in (3) below through the linear regression analysis.

$$E = Vf - C \cdot K \qquad (3)$$

K represents the inclination of the characteristics line and Vf represents the voltage intercept in the characteristics line in the expression above. In FIG. 4B, the inclination and the voltage intercept corresponding to the characteristics line f20 are K0 and Vf respectively, and the inclination and the voltage intercept corresponding to the characteristics line f21 are Kd and Vf respectively. The quantities of discharged electricity at the points at which the regression lines obtained through expression (3) and a predetermined discharge capacity rated voltage Ve intersect, i.e., battery capacities C0 and Cd in FIG. 4B, are individually determined. The battery capacities C0 and Cd can be expressed as in (4) below.

$$C0 = (Vf - Ve)/K0$$

$$Cd = (Vf - Ve)/Kd \qquad (4)$$

The capacity deterioration correction coefficient β can be obtained through the formula in (5) below by using the battery capacities C0 and Cd calculated through the formulae in (4).

$$\beta = Cd/C0 \qquad (5)$$

To continue with the explanation in reference to the flowchart presented in FIG. 2B, the two deterioration factors, i.e., the cell internal resistance deterioration factor γ and the capacity deterioration correction coefficient β are calculated with regard to each of the cells controlled by the cell controllers CC1~CC12 through the methods explained above in step S180. In other words, with a single cell controller controlling 8 cells, 8 internal resistance deterioration factors γ and 8 capacity deterioration correction coefficients β are determined by each of the cell controllers CC1~CC12. The cell controllers CC1~CC12 each select the smallest value among the 8 internal resistance deterioration factors γ, i.e., the internal resistance deterioration factor γ of the cell in the most advanced state of depletion and also each select the smallest capacity deterioration correction coefficient β among the 8 capacity deterioration correction coefficients β.

In step S190, the internal resistance deterioration factor γ and the capacity deterioration correction coefficient β selected by each cell controller in step S180 are stored in memory together with the identity of the cell corresponding to the deterioration factors before the processing in the flowchart ends.

The processing in steps S100 through S190 explained above is executed by all the cell controllers CC1~CC12. Once internal resistance deterioration factors γ and the capacity deterioration correction coefficients β are stored in memory in step S190, varying types of processing start at the individual cell controllers CC1~CC12 as described later. It is to be noted that since it is not necessary to distinguish an internal resistance deterioration factor γ from the corresponding capacity deterioration correction coefficient β in the following explanation, they are collectively referred to as a deterioration factor.

Figure 5:
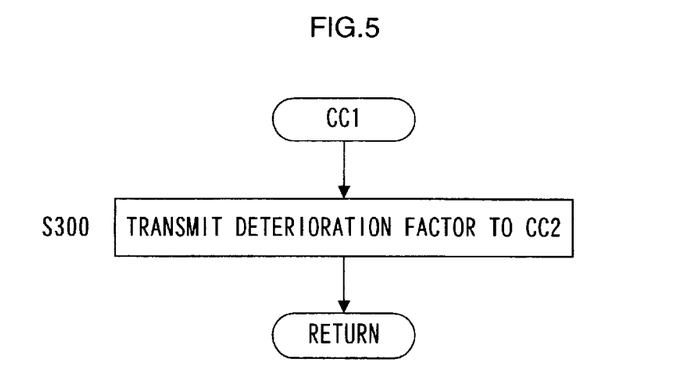
FIG. 5 presents a flowchart of the control procedure implemented by the cell controller CC1 after the deterioration factor is calculated.

First, the processing executed by the cell controller CC1 (a cell controller at an uppermost stage among the cell controllers CC1~CC12) is explained in reference to the flowchart presented in FIG. 5. In step S300, the deterioration factor stored in memory in step S190 in the flowchart presented in FIG. 2B is transmitted to the cell controller CC2.

Figure 6:
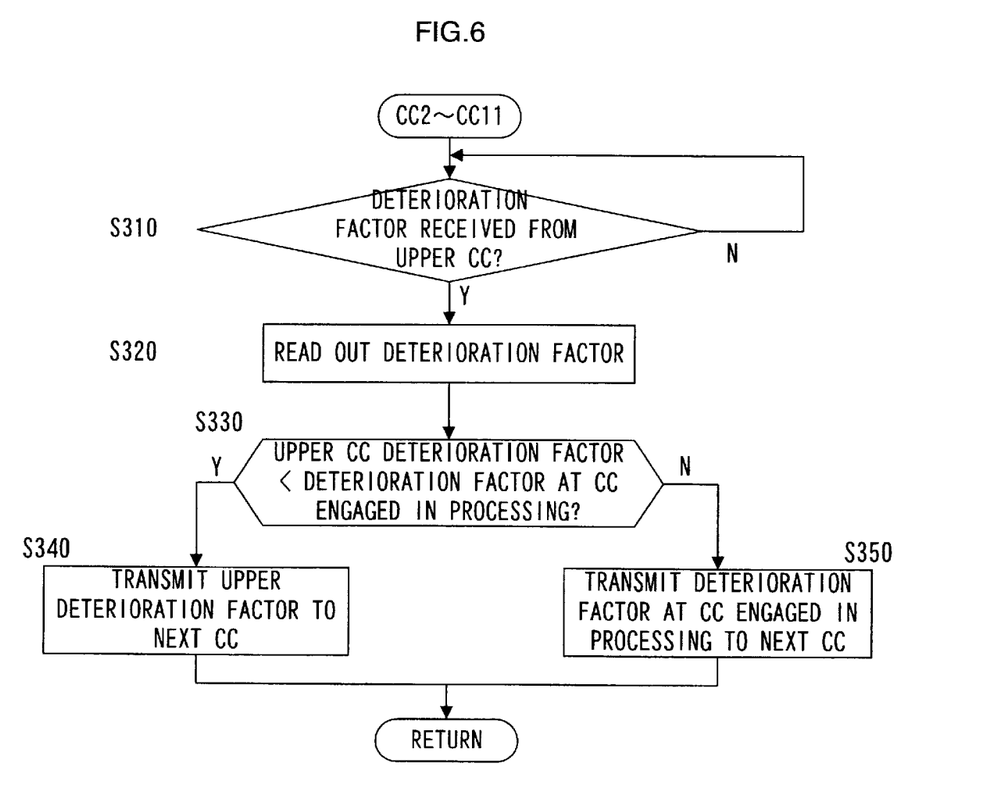
FIG. 6 presents a flowchart of the control procedure implemented by the cell controllers CC2~CC11 after the deterioration factor is calculated.

Next, the processing executed by the cell controllers CC2~CC11 (the cell controllers at subsequent stages succeeding the cell controller CC1) is explained in reference to the flowchart presented in FIG. 6. In step S310, it is judged as to whether or not the deterioration factor transmitted from the cell controller at the preceding stage has been received. For instance, during this processing, the cell controller CC2 judges as to whether or not the deterioration factor transmitted by the cell controller CC1 has been received, whereas the cell controller CC11 judges as to whether or not the deterioration factor transmitted by the cell controller CC10 has been received. If it is judged that the deterioration factor transmitted by the cell controller at the preceding stage has been received, the operation proceeds to step S320, whereas if it is judged that the deterioration factor has not been received, the operation remains in step 310 in standby until the deterioration factor is received.

In step S320, the deterioration factor having been stored in the cell controller engaged in the processing is read out. Once the deterioration factor is read out, the operation proceeds to step S330. In step S330, the deterioration factor transmitted from the cell controller at the preceding stage and received in step S310 and the deterioration factor read in step S320 are compared. If it is judged that the deterioration factor transmitted from the cell controller at the preceding stage is smaller than the deterioration factor having been stored in the cell controller, i.e., if it is judged that the cell controlled by the cell controller at the preceding stage is in a more advanced state of depletion than the cell controlled by the cell controller engaged in the processing, the operation proceeds to step S340. Otherwise, the operation proceeds to step S350.

In step S340, the deterioration factor transmitted from the cell controller at the preceding stage is transmitted to the cell controller at the next stage. For instance, if the cell controller CC2 is engaged in the processing, the deterioration factor at the cell controller CC1, which has been determined to be smaller than the deterioration factor stored at the cell controller CC2, is transmitted to the cell controller CC3 at the next stage. In step S350, on the other hand, the deterioration factor read out in step S320 is transmitted to the cell controller at the next stage. In other words, during the processing executed in steps S330~S350, the deterioration factor transmitted from the cell controller at the preceding stage is compared with the deterioration factor read at the cell controller engaged in the processing and the deterioration factor indicating a smaller value, i.e., the deterioration factor of the cell in a more advanced state of deterioration, is transmitted to the cell controller at the next stage.

Figure 7:
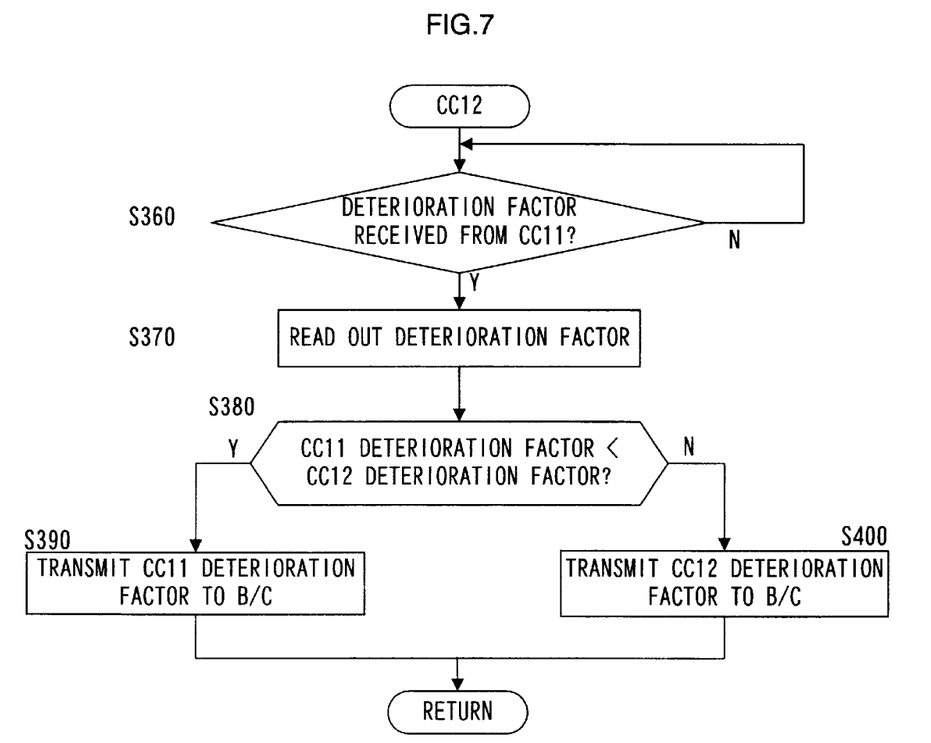
FIG. 7 presents a flowchart of the control procedure implemented by the cell controller CC12 after the deterioration factor is calculated.

Next, the processing executed by the cell controller CC12 (a cell controller at the lowermost stage) is explained in reference to the flowchart presented in FIG. 7. In step S360, it is judged as to whether or not the deterioration factor transmitted by the cell controller CC11 has been received. Through the processing executed by the cell controllers CC2~CC11 in steps S310 through S350 as shown in the flowchart presented in FIG. 6, the smallest deterioration factor is transmitted to the cell controller CC12. Once it is judged that the deterioration factor has been received, the operation proceeds to step S370, but if it is judged that the deterioration factor has not been received, the operation remains in step S360 in standby until the deterioration factor is received. In step S370, the deterioration factor having been stored at the cell controller CC12 is read out.

In step S380, the deterioration factor transmitted from the cell controller at the preceding stage, i.e., the cell controller CC11, is compared with the deterioration factor read out in step S370. If it is judged that the deterioration factor transmitted from the cell controller CC11 is smaller than the deterioration factor having been stored at the cell controller CC12, the operation proceeds to step S390. Otherwise, the operation proceeds to step S400. In step S390, the deterioration factor transmitted from the cell controller CC11 is transmitted the battery controller 3. In step S400, on the other hand, the deterioration factor read out in step S370 is transmitted to the battery controller 3.

Figure 8:
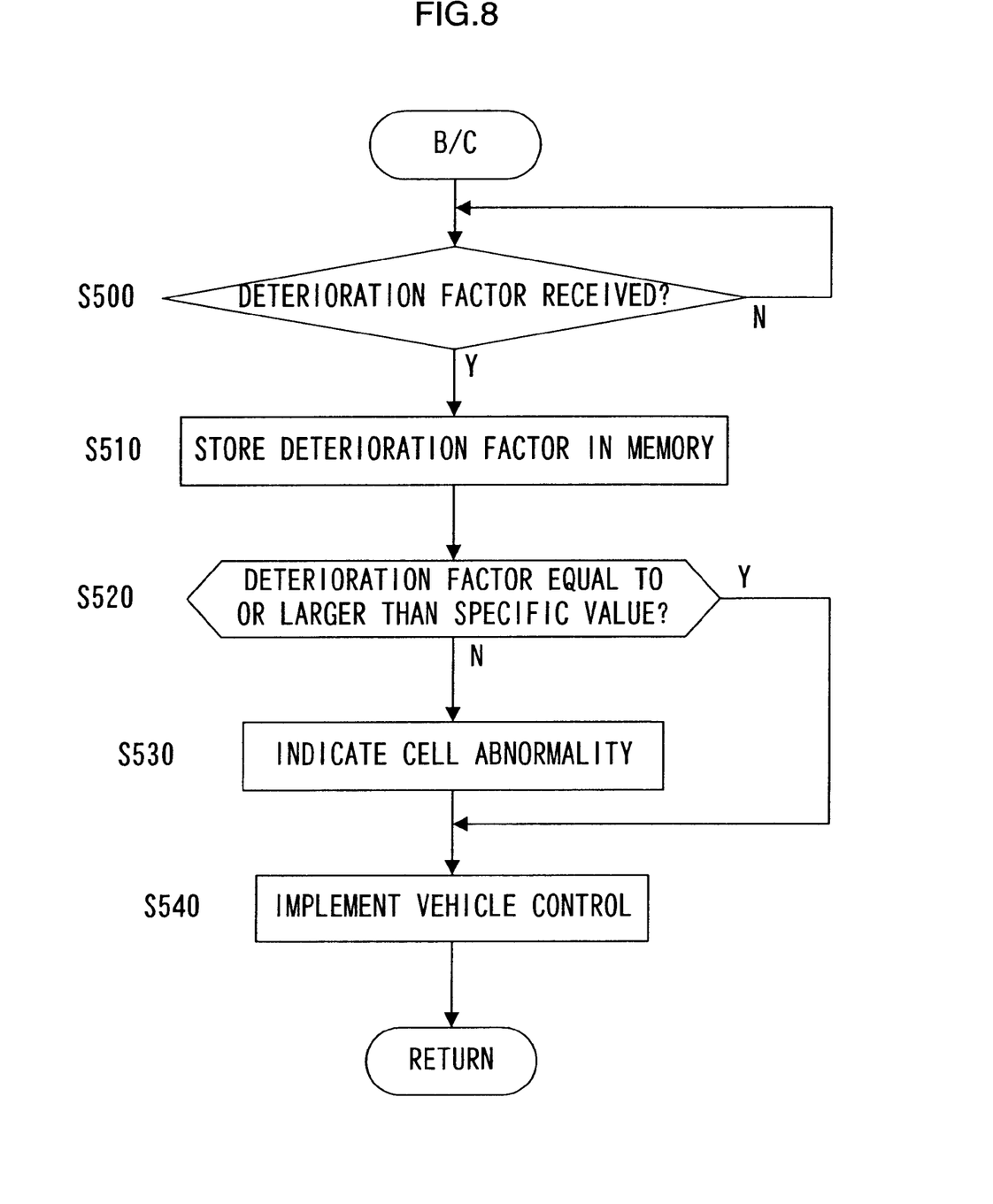
FIG. 8 presents a flowchart of the control procedure implemented by the battery controller following the processing shown in the flowcharts presented in FIG. 2A.

FIG. 8 presents a flowchart of the procedure of the control implemented by the battery controller 3. The processing in FIG. 8 starts when it is judged in step S70 in the flowchart presented in FIG. 2A that the number n of the sets of sampled data is equal to or larger than the specific value np. In step S500, it is judged as to whether or not the deterioration factor transmitted by the cell controller CC12 has been received. The deterioration factor transmitted from the cell controller CC12 is the deterioration factor of the cell in the most advanced state of deterioration among all the cells C1~C96. The operation proceeds to step S510 if it is judged that the deterioration factor has been received, whereas the operation remains in step S500 in standby until the deterioration factor is received if it is judged that it has not been received yet.

In step S510, the deterioration factor received in step S500 is stored in memory before the operation proceeds to step S520. In step S520, it is judged as to whether or not the deterioration factor stored in memory in step S510 is equal to or larger than a specific value. If it is judged that the deterioration factor is equal to or larger than the specific value, the operation proceeds to step S540. However, if it is judged that the deterioration factor is smaller than the specific value, the battery controller 3 judges that the cell with the deterioration factor transmitted thereto is becoming depleted and the operation proceeds to step S530. The specific value used to determine that a cell has become depleted is set to 0.75 in the embodiment. Namely, a cell is judged to be depleted when its performance has become deteriorated by 25 percent or more relative to the performance of a new cell.

In step S530, a message indicating that there is a cell becoming depleted is displayed at the monitor 40 and then the operation proceeds to step S540. In step S540, the vehicle is controlled by using the deterioration factor having been stored in memory in step S510. The vehicle control implemented at this time includes the cell capacity adjustment and the calculation of the battery SOC.

As explained above, each of the cell controllers CC1~CC12 calculates the deterioration factors of the plurality of cells under its control and stores in memory the deterioration factor with the smallest value (indicating the most advanced state of deterioration) in the battery pack abnormality detection apparatus according to the present invention. The cell controller CC1 transmits the stored deterioration factor to the cell controller CC2. The cell controller CC2 compares the deterioration factor having been stored therein with the deterioration factor transmitted from the cell controller CC1 and transmits the smaller deterioration factor to the cell controller CC3. Subsequently, each cell controller compares the deterioration factor having been stored therein with the deterioration factor transmitted from the cell controller at the preceding stage and transmits the deterioration factor indicating the smaller value to the cell controller at the next stage. The cell controller CC12, too, executes the processing described above and transmits the deterioration factor indicating the small value to the battery controller 3. The battery controller 3 stores in memory the transmitted deterioration factor and also judges on a cell abnormality by comparing the deterioration factor with the specific value.

Thus, since a smaller volume of data needs to be transmitted than in processing in which the deterioration factors of all the cells are calculated and transmitted to the battery controller 3, the control on the arithmetic operation processing and the like is not slowed down. As a result, a standard arithmetic processing unit in the related art can be utilized instead of a high-performance arithmetic processing unit. In addition, since a deterioration factor and the identification data identifying the cell for which the deterioration factor has been calculated constitute a set of data, the becoming depleted cell can be identified with ease if a cell becoming depleted is detected. Consequently, only the becoming depleted cell needs to be replaced and it is not necessary to replace all the cells.

Furthermore, since it is judged as to whether or not a cell abnormality has occurred by comparing the deterioration factor input to the battery controller with a specific value, an accurate detection of a depleted cell is enabled. Since a deterioration factor is calculated based upon the charging/discharging current flowing through the battery pack and the cell voltage, the cell deterioration factor can be detected with a high degree of accuracy. In addition, since the charging/discharging current and the cell voltage that are used to calculate the deterioration factor are detected simultaneously, even higher degree of accuracy is achieved in the calculation of the cell deterioration factor.

The above described embodiment is an example, and various modifications can be made without departing from the spirit and scope of the invention. For instance, the battery pack abnormality detection apparatus according to the present invention may be adopted in a hybrid vehicle, or it may be adopted in a system other than a vehicle as long as it is feasible. Moreover, the deterioration factors may be calculated through methods other than those described above. The degrees of cell depletion may be indicated by using another parameter instead of the deterioration factors explained above.

The disclosure of the following priority application is herein incorporated by reference: Japanese Patent Application No. 2001-242273 filed Aug. 9, 2001

What is claimed is:

1. A battery pack abnormality detection apparatus that detects an abnormality occurring in a battery pack achieved by connecting in a series of plurality of modules each constituted of a plurality of cells, comprising:
   - a plurality of cell controllers connected in series to individually control the modules; and
   - a battery controller that controls the plurality of cell controllers and detects a cell abnormality, wherein:
     - a cell controller at an uppermost stage among the plurality of cell controllers detects individual states of depletion of the plurality of cells in the corresponding module and outputs the state of depletion of the cell at the most advanced state of depletion among the detected states of depletion to the cell controller at the next stage;
     - a plurality of cell controllers connected at subsequent stages succeeding the cell controller at the uppermost stage each detect individual states of depletion of the plurality of cells in the corresponding module, compare the state of depletion of the cell at the most advanced state of depletion among the detected states of depletion with the state of depletion input from the cell controller at the preceding stage and output the state of depletion in a more advanced state to the cell controller at the next stage; and
     - the battery controller detects a cell abnormality based upon the state of depletion in the most advanced state input from the cell controller at a lowermost stage.

2. A battery pack abnormality detection apparatus according to claim 1, wherein:
   - the battery controller judges that the cell whose state of depletion input from the cell controller at the lowermost stage is in an abnormality state if the state of depletion input from the cell controller at the lowermost stage is determined to be more advanced than a predetermined state of depletion.

3. A battery pack abnormality detection apparatus according to claim 1, further comprising:
   - a current detection device that detects a charging/discharging current flowing at the battery pack; and
   - a voltage detection device that detects voltages at the plurality of cells, wherein:
     - the cell controllers each detect the states of depletion of the plurality of cells in the corresponding module based upon the charging/discharging current detected by the current detection device and the cell voltages detected by the voltage detection device.

4. A battery pack abnormality detection apparatus according to claim 3, wherein:
   - the charging/discharging current and the cell voltages are detected simultaneously to detect the states of depletion.

5. A battery pack abnormality detection method for detecting an abnormality occurring in a battery pack achieved by connecting in series a plurality of modules each constituted of a plurality of cells, comprising:
   - detecting individual states of depletion of the plurality of cells in the uppermost module and outputting the state of depletion of the cell at the most advanced state of depletion among the detected states of depletion to the cell controller at the next stage by a cell controller at an uppermost stage among the plurality of cell controllers;
   - detecting individual states of depletion of the plurality of cells in the subsequent module succeeding the uppermost module, comparing the state of depletion of the cell at the most advanced state of depletion among the detected states of depletion with the state of depletion input from the cell controller at the preceding stage and outputting the state of depletion in a more advanced state to the cell controller at the next stage by a plurality of cell controllers connected at subsequent stages succeeding the cell controller at the uppermost stage; and
   - detecting a cell abnormality based upon the state of depletion in the most advanced state input from the cell controller at a lowermost stage by the battery controller.

* * * * *